United States Patent [19]
Chan et al.

[11] Patent Number: 5,451,818
[45] Date of Patent: Sep. 19, 1995

[54] MILLIMETER WAVE CERAMIC PACKAGE

[75] Inventors: Steven S. Chan, Alhambra; Russel K. Kam, Torrance; Victor J. Watson, Rancho Palos Verdes, all of Calif.

[73] Assignee: TRW Inc., Redondo Beach, Calif.

[21] Appl. No.: 210,803

[22] Filed: Mar. 18, 1994

[51] Int. Cl.$^6$ .................... H01L 23/02; H01L 23/12
[52] U.S. Cl. ...................... 257/728; 257/701; 257/702; 257/703; 257/704; 257/706; 257/709; 333/247
[58] Field of Search ............... 257/701, 702, 703, 704, 257/706, 709, 710, 711, 728, 678; 333/246, 247

[56] References Cited
U.S. PATENT DOCUMENTS

| | | | |
|---|---|---|---|
| 4,340,902 | 7/1982 | Honda et al. | 257/704 |
| 5,021,759 | 6/1991 | Gamand et al. | 257/703 |

Primary Examiner—Sara W. Crane
Assistant Examiner—Carl Whitehead, Jr.

[57] ABSTRACT

An improved millimeter wave device package design in which the package includes a dielectric substrate disposed upon a supporting base such that the substrate extends substantially along the peripheral edge of the base, defining a central aperture. A solid conductive layer substantially covers the first surface of the dielectric substrate and a series of conductive transmission lines are formed on an opposing second surface of the substrate. A dielectric layer is disposed upon and substantially covers the transmission lines and the second surface of the substrate upon which they are formed. A seal ring is disposed upon and the dielectric layer and a conductor electrically connects the device to the transmission lines. A lid is sealed atop the seal ring completes the hermetical seal for the device.

12 Claims, 1 Drawing Sheet

MILLIMETER WAVE CERAMIC PACKAGE

BACKGROUND OF THE INVENTION

1. Field of the Invention

This invention relates generally to microelectronic packages and, more particularly, to an improved ceramic microwave device package and a method for making the package.

2. Discussion

Recent advances in microelectronic technologies have resulted in dramatic improvements in operating frequency capabilities of specialized electronic devices such as monolithic microwave integrated circuits (MMICs) and other similar millimeter wave and microwave devices. These devices are well suited for and often used in all types of military and commercial applications that require low radio frequency (RF) losses at high operating frequencies.

However, while these devices may be state of the art in terms of size, weight, performance and cost, the performance capabilities of the devices can be compromised by mounting the device into a package that can cause the signal to noise ratio to increase at higher operating frequencies. These packages typically allow an electronic device to be mounted within a suitable hermetic enclosure while enabling RF input and output (I/O) signals, as well as a DC bias signal, to be communicated through the package walls to the device itself, or conversely, from the device to external complimentary circuits.

Currently available RF packages of this type, and more specifically the package transitions, are often found to have high RF losses, voltage reflections, electrical mismatching and discontinuity inadequacies that exceed acceptable limits and which can limit frequency performance capabilities to approximately 30 Ghz. This often fails to maximize the performance potential of an electronic device, or can in fact even degrade device performance.

There is therefore a continuing need for an improved device package, particularly for microwave and millimeter wave amplifiers operating in higher frequency ranges.

SUMMARY OF THE INVENTION

The present invention addresses these packaging inadequacies by providing an improved package design as well as an improved process for fabricating the package. The package includes a supporting base having a dielectric substrate disposed thereon such that the substrate extends substantially along the peripheral edge of the base and thereby defines an aperture therein. A solid conductive layer substantially covers a first surface of the dielectric substrate and a series of conductive transmission lines are formed on an opposing second surface of the substrate. A dielectric layer is disposed upon and substantially covers the second surface of the substrate and the transmission lines formed thereon. A seal ring is disposed upon the dielectric layer and a conductor electrically connects the device to the transmission lines. A lid is sealed atop the seal ring to thereby hermetically seal the device between the ring, lid and base.

Use of a controlled etching process in forming the conductive transmission lines enables improved dimensional control and definition over those achievable using more conventional methods of thick film printing. Locating these etched conductive transmission lines between the base or ground plane and the dielectric tape layer, both having controlled geometric and electrical characteristics, allows the package to handle the ever increasing frequency range, power and reliability requirements of today's and future electronic devices.

Additional advantages and features of the present invention will become apparent from the subsequent description and the appended claims, taken in conjunction with the accompanying drawings.

DETAILED DESCRIPTION OF A PREFERRED EMBODIMENT

Figure 1:
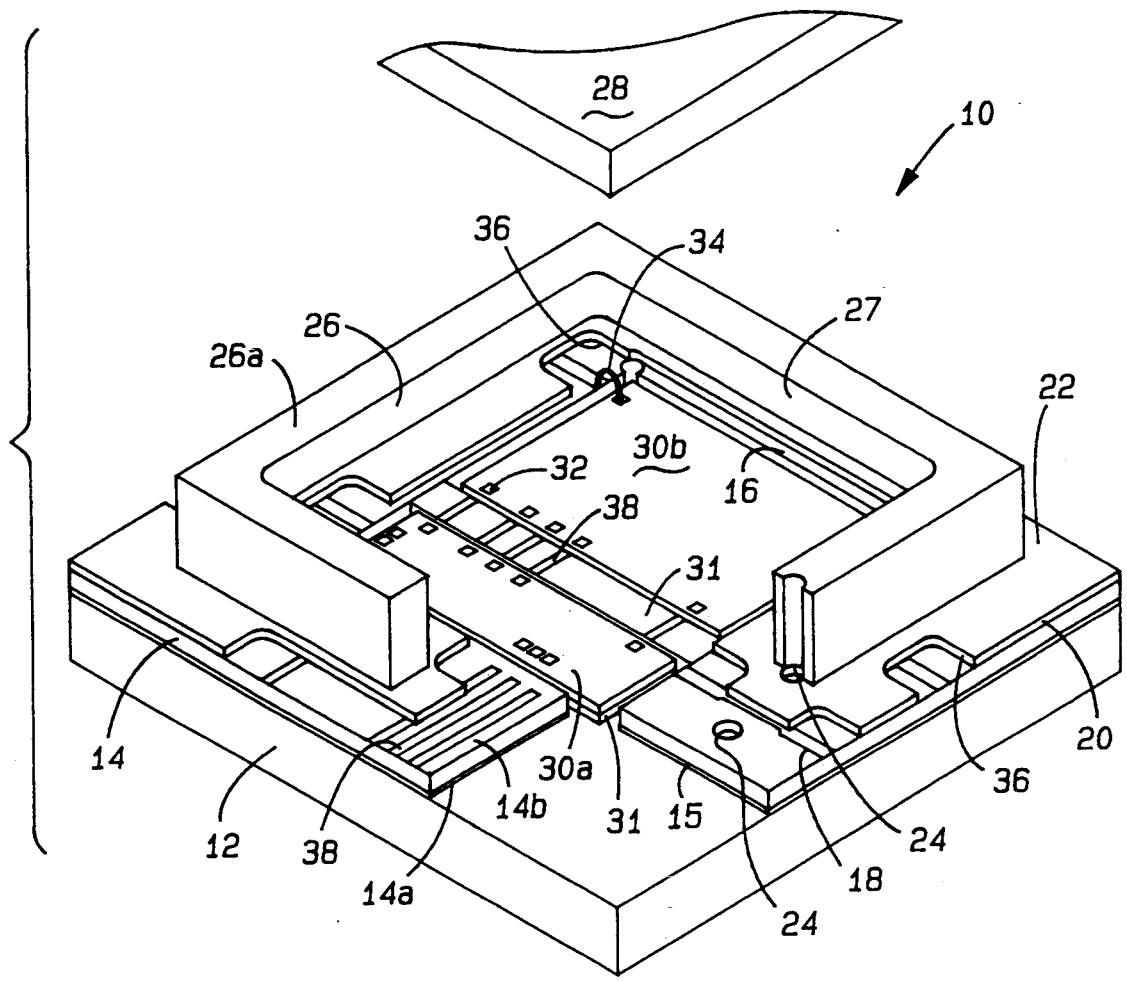
FIG. 1 is a partially exploded isometric view of the ceramic package according to the teachings of the present invention.

Referring now to the drawings, and in particular to FIG. 1, a millimeter wave ceramic package according to the present invention is indicated generally at 10. Package 10 includes a base 12, preferably formed of an electrically and thermally conductive material such as copper tungsten (CuW) or of a suitable ceramic material. In one form of the invention, wherein package 10 is configured so as to house multiple millimeter wave devices, in this case two devices, base 12 is approximately 1.0 cm by 1.0 cm.

Base 12 has hermetically sealed, bonded or soldered thereto a dielectric substrate such as ceramic substrate 14. Substrate 14 is substantially flat and extends generally along the peripheral edge of base 12, thereby defining a central aperture 16. Opposing surfaces 14a and 14b of substrate 14 are printed and fired, preferably by a thick film process commonly known to those having skill in the art, with an etchable conductive layer, such as ESL #8881B, commercially available from Electro-Science Laboratories, Inc., or a suitable equivalent. More specifically, surface 14a, disposed against base 12, is preferably printed with a solid or continuous conductive layer 15 which is not etched. Conductive layer 15 forms a ground plane for a series of conductive controlled geometry RF transmission lines 18 etched into opposite surface 14b. RF transmission lines 18 extend generally outwardly on substrate 14, between aperture 16 and an outer edge of base 12. The transmission lines 18 may be configured in the manner indicated in FIG. 1 or may alternately be of any suitable number or configuration, depending upon the number and type of devices to be packaged.

Upon etched pattern surface 14b of substrate 14, a dielectric tape 20 is permanently laminated and fused to substrate 14, preferably by a controlled firing process such as a multi-layer ceramic process, a low temperature co-fired ceramic process and/or a transfer tape lamination process. The upper unbonded surface 20a of dielectric tape 20 thereafter has a conductive layer 22 applied thereto, which is likewise preferably applied using a controlled firing process. Layer 22 cooperates with conductive layer 15 to complete the ground planes for RF transmission lines 18 which are disposed therebetween and separated therefrom by dielectric layers 14 and 20.

If base 12 is formed of a ceramic material rather than a conductive material, a number of controlled geometry vias 24 are each further formed through substrate 14 and dielectric layer 20 as cylindrically shaped holes. Each via 24 is preferably thereafter filled with a suitable conductive material such as gold (Au), silver (Ag), palladium/silver (Pd/Ag) or platinum/silver (Pt/Ag). Vias 24 electrically connect electrically conductive layer 15a to conductive layer 22 in order to form a complete electrical and/or RF ground.

A conductive rim or seal ring 26 extends atop and preferably approximately along the center of layers 14 and 20. Seal ring 26 is preferably made of Kovar ® or other suitable conductive material and is permanently bonded, brazed or soldered to conductive layer 22. Seal ring 26 cooperates with base 12 to form a cavity 27 in which a millimeter wave or microwave device may be packaged and vias 24 may also extend therethrough. Seal ring 26 preferably includes an upper surface 26a which provides a convenient surface to which a lid 28, preferably made of a suitable conductive material such as Kovar ®, may be attached. Lid 28 is preferably hermetically sealed, such as by soldering or brazing, to surface 26a of seal ring 26 in order to enclose and hermetically seal the device within cavity 27.

An electronic device, preferably an MMIC chip or other millimeter or microwave device or a multi-chip module, can be sealed in package 10, within seal ring 26. Although the figures illustrate a pair of devices 30a and 30b mounted inside package 10, it can be appreciated that package 10 can be appropriately configured to house only one or alternately an array of millimeter wave or other such devices, as well as other circuit components. Devices 30a and 30b are preferably mounted onto base 12, which preferably is formed to an appropriate height, or otherwise includes built-up surfaces 31, which are preferably made of the same material as base 12 and formed so as to support devices 30 in an optimum manner. Each device 30 is electrically coupled to one or more RF transmission lines 18, such as by wire or ribbon bonds 34.

While hermetically sealed within cavity 27 of package 10, each device 30 electrically communicates through the package structure via RF transmission lines 18. As shown in more detail in FIG. 2, the controlled geometry RF transmission lines 18 each preferably consist of three adjoining segments. A first path segment 18a, extending external to the package wall, and a second path segment 18b, extending inside the cavity 27, are each modeled as a microstrip line. The path segment 18c, extending underneath seal ring 26, is modeled as a stripline which may be shielded by electrically grounded filled vias 24. Each path segment 18c is preferably narrower in width than the path segment 18a in order to maintain a uniform (preferably 50 ohm) impedance through varying materials and environments wherein the effective dielectric constant typically varies between package sections.

Dielectric layer 20 preferably has further formed therein a series of generally U-shaped recesses 36, each recess 36 exposing a portion of at least one RF transmission path 18, preferably a segment 18a or 18b of path 18. Each path segment 18a preferably lies underneath portions of dielectric layer 20 intermediate a pair of opposing recesses 36. Package 10 may also further include a number of DC input/output or RF lines 38, preferably formed of an etchable conductive thick film by a controlled etching process on built-up surfaces 31 or dielectric layer 14 for use in interconnecting devices 30.

Communication between a device 30 sealed within package 10 and other interconnected electronic components exterior to package 10 is accomplished through the controlled geometry RF transmission lines 18. One or more of controlled geometry lines 18 may also act as a DC bias line. The RF I/O ports are thus able to perform within a specific frequency range by controlling the geometric features and materials about the ports.

Figure 2:
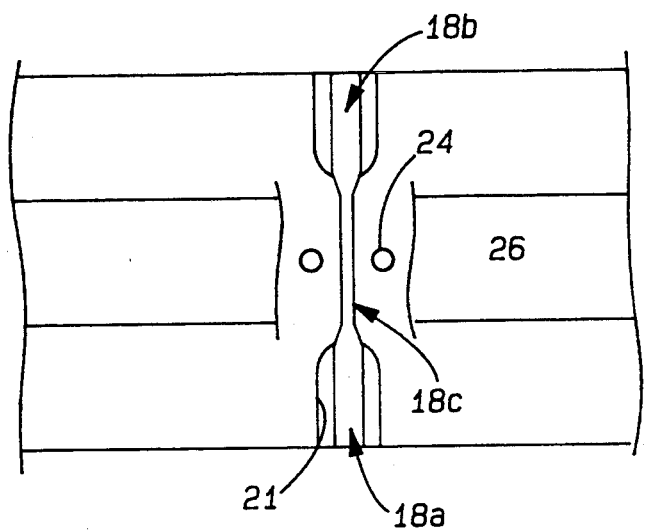
FIG. 2 is a plan view, partially broken away, further illustrating the configuration of a typical controlled geometry RF transmission line.

As shown in FIG. 2, the conductive paths 18 in path segment 18c are preferably consistent in width, to minimize any discontinuity at the package wall interface. The RF lines 18 lie on the same plane as device bonding pads 32 in order to minimize inductance of the interconnecting medium (wire or ribbon bond 34). Because the cavity walls are electrically conductive or at least connected with RF ground through controlled geometry electrically conductive filled vias 24, the cavity of package 10 approximates a rectangular metal cavity, which removes a TE 101 cutoff frequency beyond the device operating frequency region. The effect of the device as an insulator launched into a cavity, the cutoff frequency is also taken into account.

The use of a controlled conductive film etching process for the high frequency RF transmission lines 18 enables these RF transmission lines to have drastically improved dimensional control and definition over those achievable using current methods of thick film printing. Locating the etched conductive RF transmission lines 18 between the base 12 or ground plane and the laminated dielectric tape layer 20, both having controlled geometric and electrical characteristics, allows package 10 to handle the ever increasing frequency range, power and reliability requirements of today's and future electronic devices by providing economical commonly stocked items and a simple approach to package design and manufacture. The best performance advantages of both thick and thin film technology is combined to achieve theoretical and experimental results that have indicated extended operating frequencies of up to 60 Ghz and beyond.

This package manufacturing technique is further without the usual shrinkage problems common with those made using conventional high or low temperature co-fired ceramic package techniques. The present configuration further minimizes mechanical interconnections, thus enhancing electrical integrity and system performance while reducing volume, weight and manufacturing costs. By using compatible materials which will withstand multiple excursions into firing (laminating) temperatures, any adhesion and oxide inadequacies common to thin films when exposed to elevated temperatures are eliminated. High density, multilayer, multichip module (MCM) interconnection packaging schemes allow RF transmission lines, internal ground planes, RF shield and DC interconnection from layer to layer in a single package. This package may further be batch processed to achieve lower manufacturing cost while maintaining electrical performance.

The table below shows the actual measured RF performance of a device made in accordance with the teachings of the present invention which indicates that the RF transmission line path is matched with a 50 ohm impedance:

| ACTUAL MEASURED R.F. PERFORMANCE | | | | |
| --- | --- | --- | --- | --- |
| | 32 GHz (db) | 38 GHz (db) | 43 GHz (db) | 49 GHz (db) |
| Calibration* Loss | −1.0096 | −0.6122 | −0.7127 | −0.5805 |
| Total Loss | −1.2781 | −1.0924 | −1.3222 | −1.7795 |
| Actual Input/ Output Loss | −0.2685 | −0.4802 | −0.6095 | −1.1990 |

*Calibration Loss = Thru line loss + connector loss.

The insertion loss of each RF line is less than 0.5 db from 5 Mhz to 25 Ghz and less than 1 db up to 44 Ghz, with isolation in excess of 30 db. The package of this invention is thus adaptable to a wide variety of applications including test fixtures, single or multiple chip high frequency packages, microstrip line-to-stripline-to-microstrip line transitions, waveguide probe-to-stripline-to-microstrip transitions in both military and commercial fields.

The foregoing discussion discloses and describes merely exemplary embodiments of the present invention. One skilled in the art will readily recognize from such discussion, and from the accompanying drawings and claims, that various changes and modifications can be made therein without departing from the spirit and scope of the invention as defined in the following claims.

What is claimed is:

1. A hermetically sealable package for an electronic device comprising:
   a supporting base;
   a dielectric substrate disposed on said base, said substrate extending substantially along the peripheral edge of said base to thereby define an aperture therein;
   a solid electrically conductive layer substantially covering a first surface of said dielectric substrate;
   a series of continuous transmission lines disposed on an opposing second surface of said substrate:
   a dielectric layer disposed upon and substantially covering said second surface of said substrate and middle portions of said transmission lines while leaving inner and outer ends of the transmission lines exposed;
   a seal ring disposed upon said dielectric layer;
   a conductor for electrically connecting said device to at least one inner end of one of said transmission lines; and
   a lid sealed atop said seal ring to thereby seal said device between said seal ring, lid and base.

2. The package of claim 1 wherein said package further comprises at least one electrically conductive path formed on a surface of said base exposed by said aperture in said substrate, said package further including means for electrically connecting said conductive path to said electronic device.

3. The package of claim 1 wherein said package further includes at least one via formed through said substrate and said dielectric material, said via being filled with an electrically conductive material.

4. The package of claim 3 wherein said vias are disposed beneath said seal ring.

5. The package of claim 1 wherein said base is formed of an electrically conductive material.

6. The package of claim 1 wherein said dielectric layer includes at least one opening formed therethrough, said opening exposing a portion of at least one said transmission line.

7. The package of claim 1 wherein said transmission line is comprised of three sections, a first section being wider than a third section and a second section being disposed intermediate said first and third sections, said transmission line being tapered in width between said sections.

8. The package of claim 1 wherein at least one said transmission line is a DC bias line.

9. The package of claim 1 wherein said means for electrically connecting is a wire.

10. The package of claim 1 wherein said base is formed of a dielectric material.

11. The package of claim 1 wherein said means for electrically connecting is a ribbon.

12. A hermetically sealed package for a high frequency semiconductor device operating in frequencies in excess of 5 MHz, said package comprising:
    a generally rectangular supporting base;
    an annular ceramic substrate disposed on said base, said ceramic substrate having a generally flat upper surface and an opposing lower surface;
    a ground plane sandwiched between an upper surface of the base and the lower surface of the substrate;
    a plurality of transmission lines on the upper surface of the substrate, each transmission line being a continuous strip of conductive material having an outer end, a middle portion and an inner end;
    a dielectric layer on the upper surface of the substrate, said dielectric layer covering middle portions of said transmission lines while leaving said inner and outer ends of the transmission lines exposed;
    an annular seal ring disposed upon the dielectric layer, said seal ring being made of electrically conductive material and having at least one via extending therethrough, said via being aligned with openings in the dielectric layer and the substrate to make electrical connection to the ground plane;
    at least one of said high frequency devices being mounted within the aperture and having a plurality of bonding pads on one surface thereof;
    means for making electrical connection between the bonding pads and the inner ends of the transmission lines; and
    wherein said transmission lines are formed of etchable material with the inner and outer ends being tapered to provide preselected matched impedances.

* * * * *